United States Patent
Xiang et al.

(10) Patent No.: US 11,726,110 B2
(45) Date of Patent: Aug. 15, 2023

(54) CONNECTING DEVICE FOR CONNECTING AN ELECTRICAL DEVICE UNDER TEST TO A TEST INSTRUMENT

(71) Applicant: Jabil Circuit (Singapore) Pte. Ltd., Singapore (SG)

(72) Inventors: Xiang-Lin Xiang, Guangzhou (CN); Fang Chen, Guangzhou (CN); Shan-Huai Lan, Guangzhou (CN)

(73) Assignee: Jabil Circuit (Singapore) Pte. Ltd., Singapore (SG)

(*) Notice: Subject to any disclaimer, the term of this patent is extended or adjusted under 35 U.S.C. 154(b) by 0 days.

(21) Appl. No.: 17/873,255

(22) Filed: Jul. 26, 2022

(65) Prior Publication Data

US 2023/0138996 A1 May 4, 2023

(30) Foreign Application Priority Data

Oct. 29, 2021 (CN) .......................... 202122634500.9

(51) Int. Cl.
*G01R 1/04* (2006.01)
*G01R 31/26* (2020.01)

(52) U.S. Cl.
CPC ........ *G01R 1/0416* (2013.01); *G01R 31/2601* (2013.01)

(58) Field of Classification Search
CPC .......... G01R 1/02; G01R 1/04; G01R 1/0408; G01R 1/0416; G01R 1/06; G01R 1/067; G01R 1/06705; G01R 1/073; G01R 1/07371; G01R 1/07392
See application file for complete search history.

(56) References Cited

U.S. PATENT DOCUMENTS

| | | | | |
|---|---|---|---|---|
| 6,025,729 A | * | 2/2000 | Van Loan | G01R 1/07328 324/756.07 |
| 2004/0257097 A1 | * | 12/2004 | Beaucag | G01R 31/2808 324/754.15 |
| 2008/0054910 A1 | * | 3/2008 | Lee | G01R 31/2805 324/555 |
| 2014/0327462 A1 | | 11/2014 | Jeong et al. | |

* cited by examiner

Primary Examiner — Giovanni Astacio-Oquendo
Assistant Examiner — David B Frederiksen
(74) Attorney, Agent, or Firm — Young Basile Hanlon & MacFarlane, P.C.

(57) ABSTRACT

A connecting device for electrically connecting signal contact portions of an electrical device under test includes a lower modular unit and an upper modular unit. The lower modular unit includes a port substrate and a plurality of lower connecting terminals electrically connected with the port substrate. The upper modular unit is disposed above the lower modular unit and includes a plurality of upper connecting terminals movable relative to an upper wall. The upper connecting terminals are movable as a result of a downward pressing of the electrical device to the upper modular unit to project outwardly of the upper wall and to electrically connect with the signal contact portions. The upper connecting terminals are electrically connected with the lower connecting terminals.

14 Claims, 6 Drawing Sheets

CONNECTING DEVICE FOR CONNECTING AN ELECTRICAL DEVICE UNDER TEST TO A TEST INSTRUMENT

CROSS-REFERENCE TO RELATED APPLICATION

This application claims priority of Chinese Patent Application No. 202122634500.9, filed on Oct. 29, 2021.

FIELD

The disclosure relates to a connecting device, and more particularly to a connecting device for connecting an electrical device under test to a test instrument.

BACKGROUND

A conventional connecting device is used to connect an electrical device under test to a test instrument. For example, a mother board of a camera is a device under test (DUT) and has a plurality of connectors under test. The connecting device has a plurality of mating adapters which are snap-fit connected with the connectors under test. Such snap-fit connection of the connectors are susceptible to wear and breakage after prolonged use due to repeated insertion and removal of the connectors.

SUMMARY

Therefore, an object of the disclosure is to provide a connecting device that can alleviate at least one of the drawbacks of the prior art.

According to the disclosure, the connecting device for electrically connecting an electrical device under test which has a plurality of signal contact portions includes a lower modular unit and an upper modular unit. The lower modular unit includes a port substrate and a plurality of lower connecting terminals. Each lower connecting terminal is electrically connected with the port substrate at a lower end thereof. The upper modular unit is disposed above the lower modular unit and includes a plurality of upper connecting terminals movable relative to an upper wall. Each upper connecting terminal has an upper contact end which is movable as a result of a downward pressing of the electrical device under test on the upper modular unit to project outwardly of the upper wall and to electrically connect with one signal contact portions. The upper connecting terminals are electrically connected with the lower connecting terminals of the lower modular unit.

With the upper contact ends of the upper connecting terminals of the upper modular unit contacting and electrically connecting with the signal contact portions of the electrical device under test in a pressing manner, structure wearing due to a snap-fit engagement can be avoided and service life of the connecting device may be prolonged.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
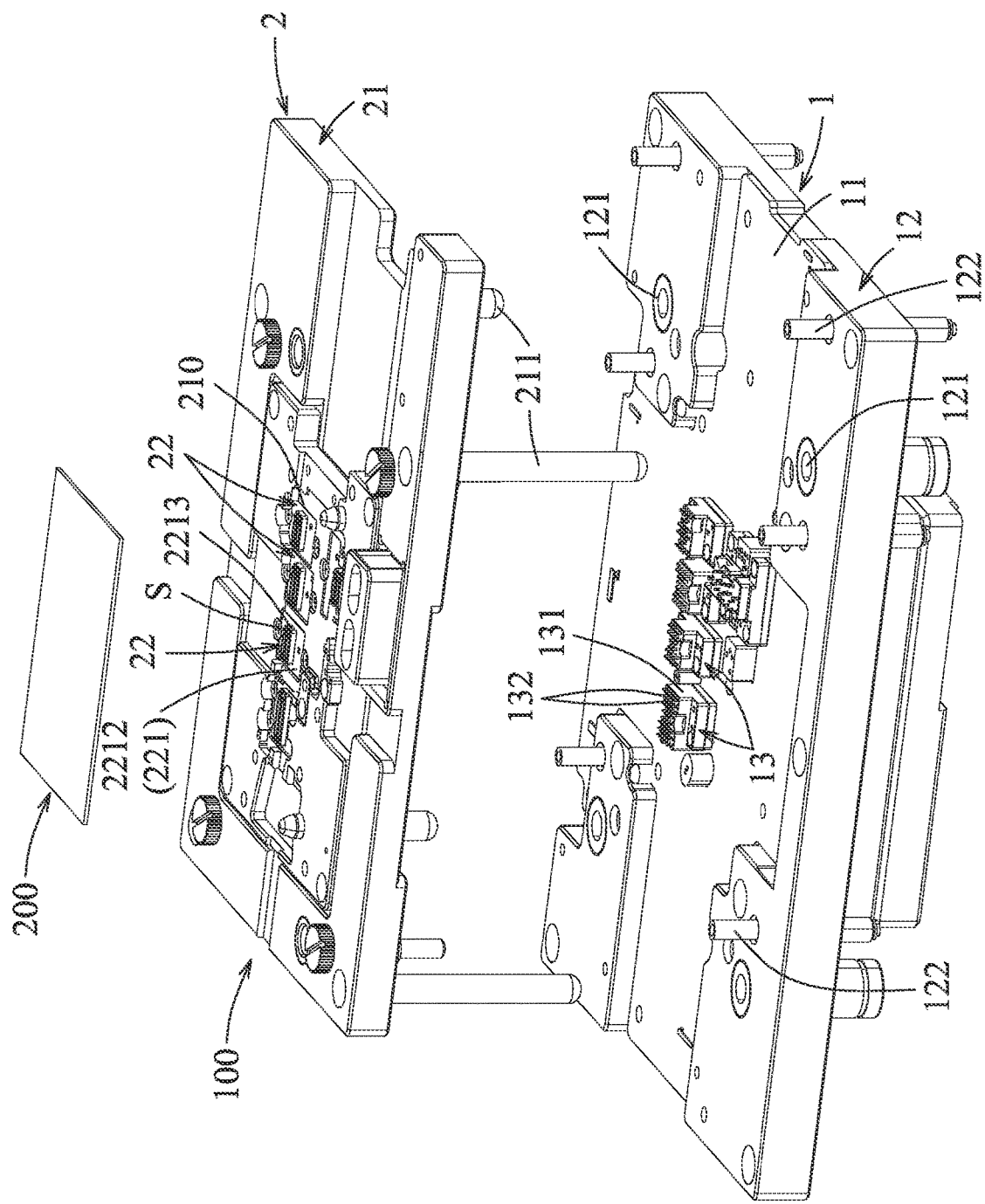
FIG. 1 is an exploded perspective view illustrating an embodiment of a connecting device according to the disclosure and an electrical device under test.
Figure 2:
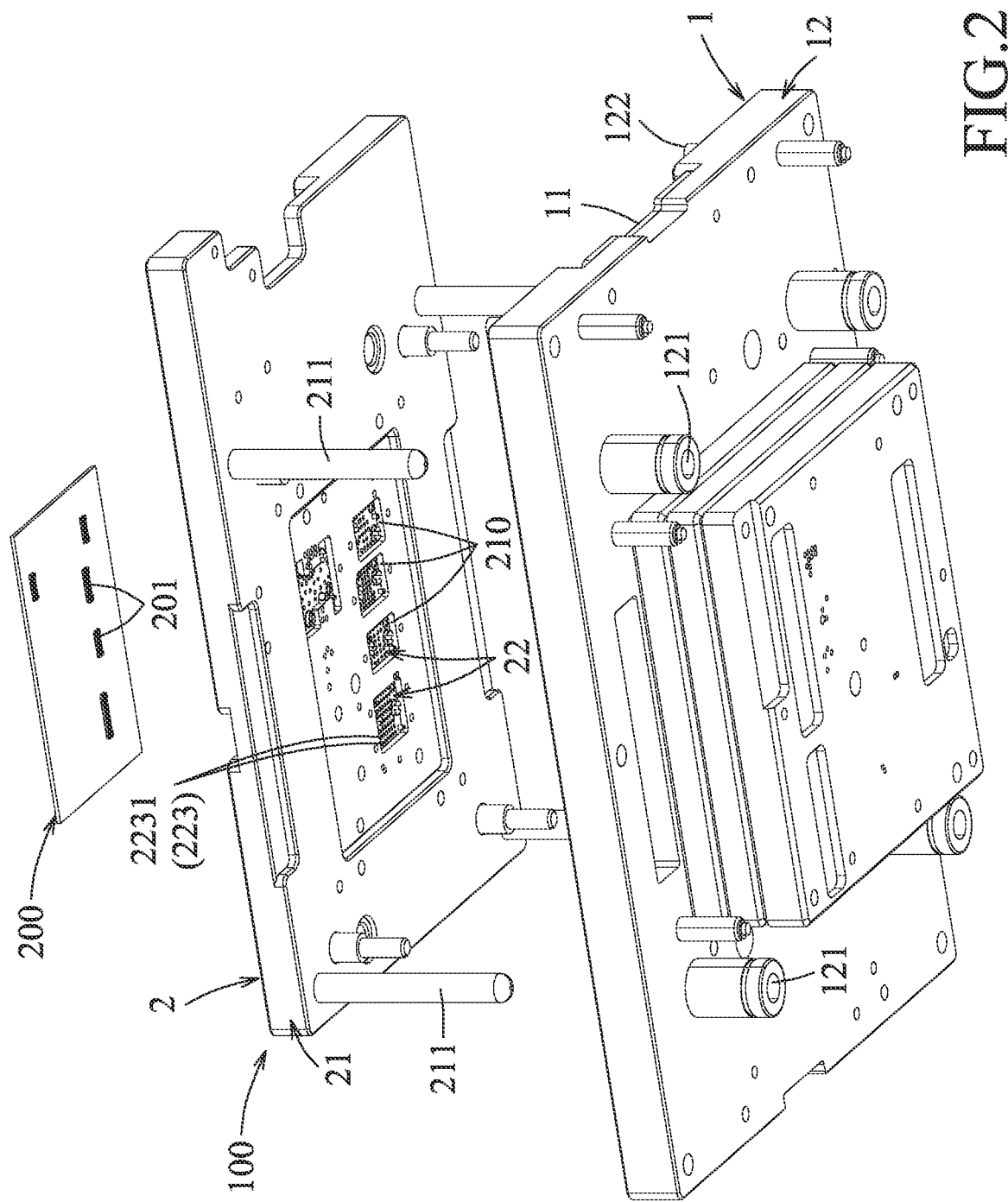
FIG. 2 is an exploded perspective view of the embodiment and the electrical device taken from another angle.
Figure 3:
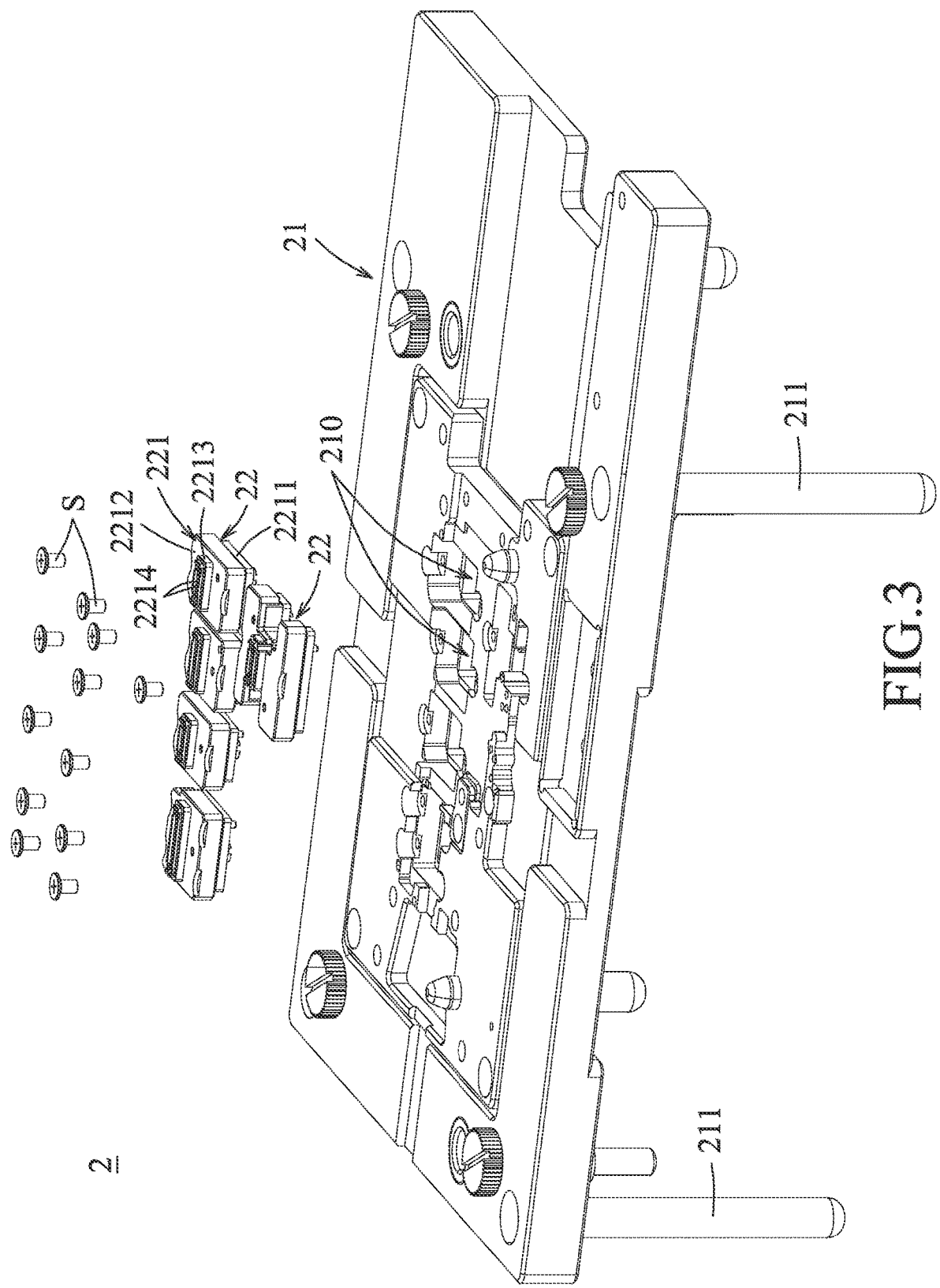
FIG. 3 is an exploded perspective view of an upper modular unit of the embodiment.
Figure 4:
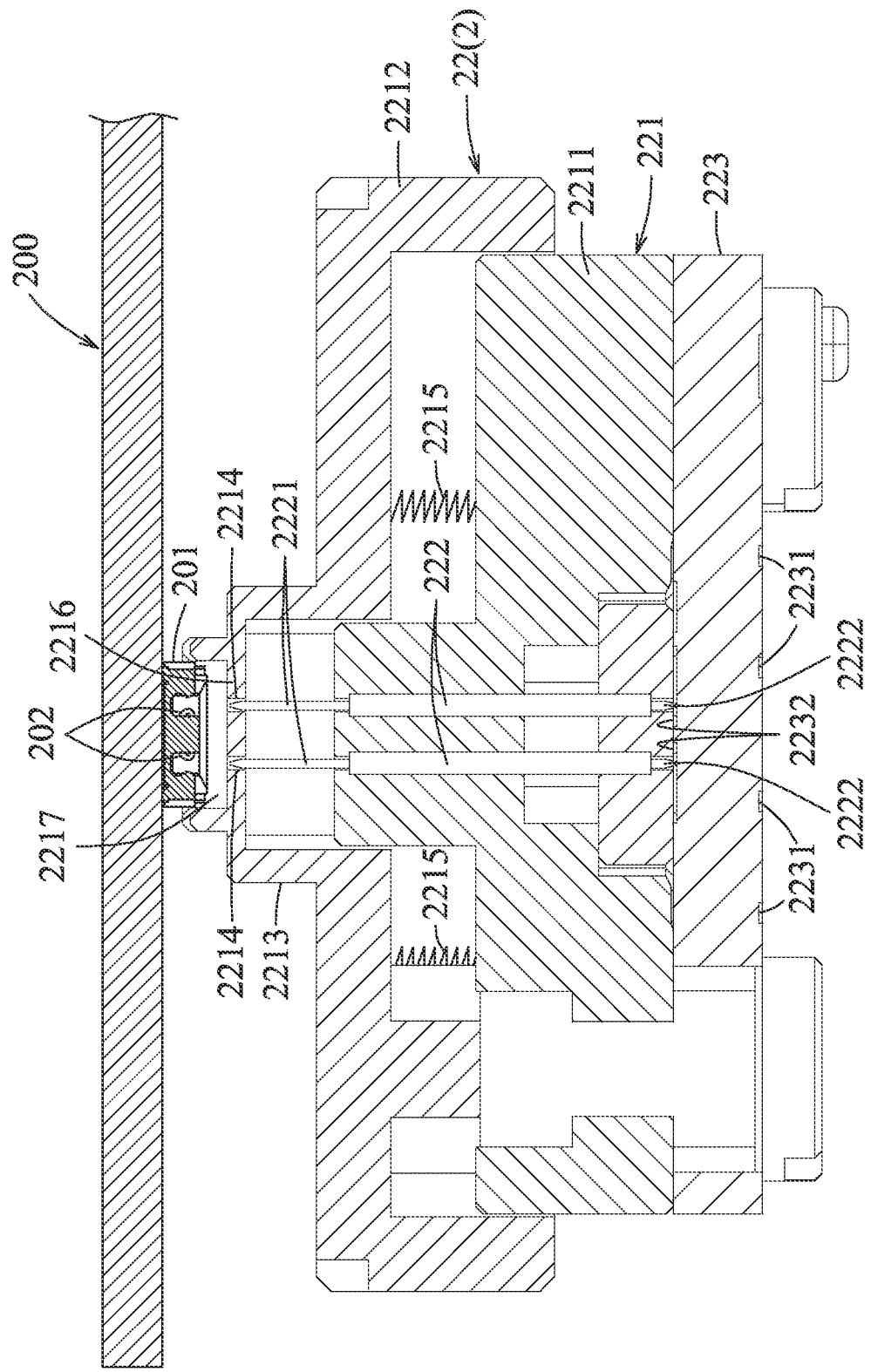
FIG. 4 is a sectional view illustrating an upper module of the upper modular unit and the electrical device in a state when the upper module is not connected with the electrical device.

Referring to FIGS. 1 and 2, an embodiment of a connecting device 100 according to the disclosure is adapted for electrically connecting an electrical device under test 200, such as a printed circuit mother board of a camera. The electrical device under test 200 has a plurality of insert plugs 201 and a plurality of signal contact portions 202 disposed on the insert plugs 201 (see FIG. 4). The insert plugs 201 may be connectors and the signal contact portions 202 may be terminals disposed on the connectors. In other embodiments, the signal contact portions 202 may be contacts on a printed circuit board. The connecting device 100 of the embodiment includes a lower modular unit 1 and an upper modular unit 2.

The lower modular unit 1 includes a port substrate 11 which is connectable with a test instrument (not shown), a lower module seat 12 on which the port substrate 11 is disposed, and a plurality of lower modules 13 which are disposed on the port substrate 11. Each lower module 13 has a lower module housing 131 and a plurality of lower connecting terminals 132 which are mounted on the lower module housing 131 to be kept spaced apart from each other. Lower ends of the lower connecting terminals 132 are electrically connected with the port substrate 11. In this embodiment, the lower connecting terminals 132 are POGO pins. In other embodiments, the lower connecting terminals 132 may be in the form of any type of terminal. The lower module housing 131 of each lower module 13 is removably mounted on the port substrate 11 for facilitating replacement thereof in case of failure without the need to replace the whole lower modular unit 1.

With reference to FIGS. 1 to 4, the upper modular unit 2 is disposed above the lower modular unit 1, and includes an upper module seat 21 which has a plurality of slots 210 formed therethrough, and a plurality of upper modules 22 which are respectively disposed in the slots 210 and aligned with the lower modules 13. Each upper module 22 is removably fastened to the upper module seat 21 by means of a detachable screw (S) so as to facilitate replacement of the upper module 22 without the need to replace the whole upper modular unit 2. In this embodiment, at least two of the upper modules 22 have different dimensions from each other. The upper module seat 21 is movable relative to the lower module seat 12 in an up-down direction. The upper and lower module seats 21, 12 respectively have upper and lower movement stabilizing portions 211, 121 which are matingly engageable with each other to stabilize the up-down movement of the upper module seat 21 relative to the lower module seat 12. In this embodiment, the upper movement stabilizing portion 211 is in the form of a post extending from a lower surface of the upper module seat 21, and the lower movement stabilizing portion 121 being in the form of a hole extending through the lower module seat 12. In other embodiments, the upper and lower movement stabilizing portions 211, 121 may be any type of slidable structures.

Each upper module 22 has an upper module housing 221 and a plurality of upper connecting terminals 222. The upper module housing 221 has a base seat portion 2211 and a movable portion 2212 which is disposed on and movable relative to the base seat portion 2211 in the up-down direction. The movable portion 2212 has an upper wall 2216 which has through holes 2214 formed therethrough, and a socket 2213 which projects from the upper wall 2216 and which defines a socket port 2217 that is communicated with the through holes 2214. A corresponding insert plug 201 of the electrical device 200 is fittingly insertable into the socket port 2217. The upper connecting terminals 222 are mounted on the base seat portion 2211 to be kept spaced apart from each other and are inserted into the through holes 2214, respectively. The movable portion 2212 is resiliently movable relative to the base seat portion 2211 between an initial position and a pressed position. For example, a plurality of biasing members 2215, such as biasing springs, are disposed between the movable portion 2212 and the base seat portion 2211. The upper connecting terminals 222 may be POGO pins in this embodiment, and have upper and lower contact ends 2221, 2222 which are resiliently movable relative to the base seat portion 2211 by means of springs (not shown) disposed therein.

With reference to FIGS. 1 to 4, when the upper module 22 of the upper modular unit 2 is not pressed, the movable portion 2212 of the upper module 22 is in the initial position. The upper contact ends 2221 of the upper connecting terminals 222 are retracted in the through holes 2214 to be protected by the movable portion 2212 and the upper module 22 is not connected with the electrical device 200.

Figure 5:
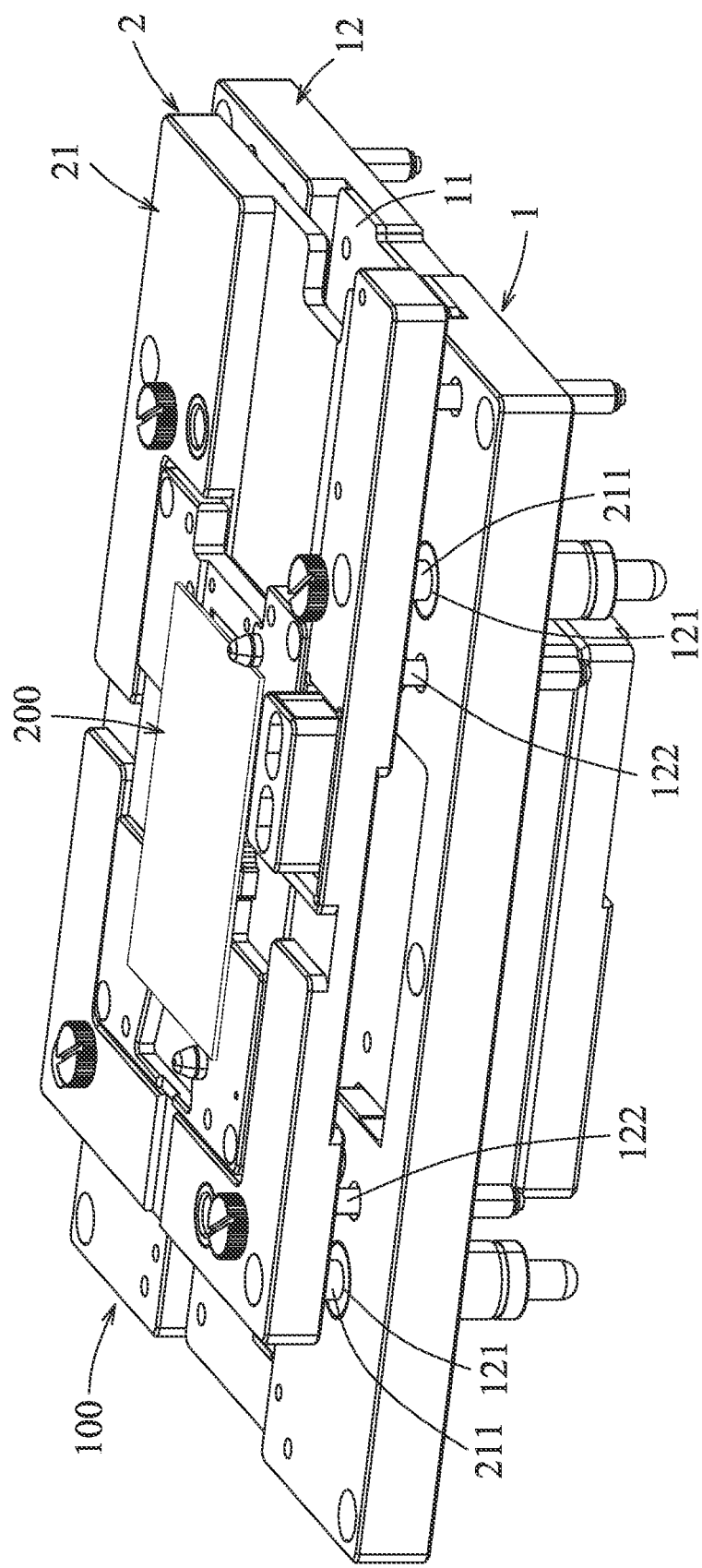
FIG. 5 is a perspective view of the embodiment and the electrical device.
Figure 6:
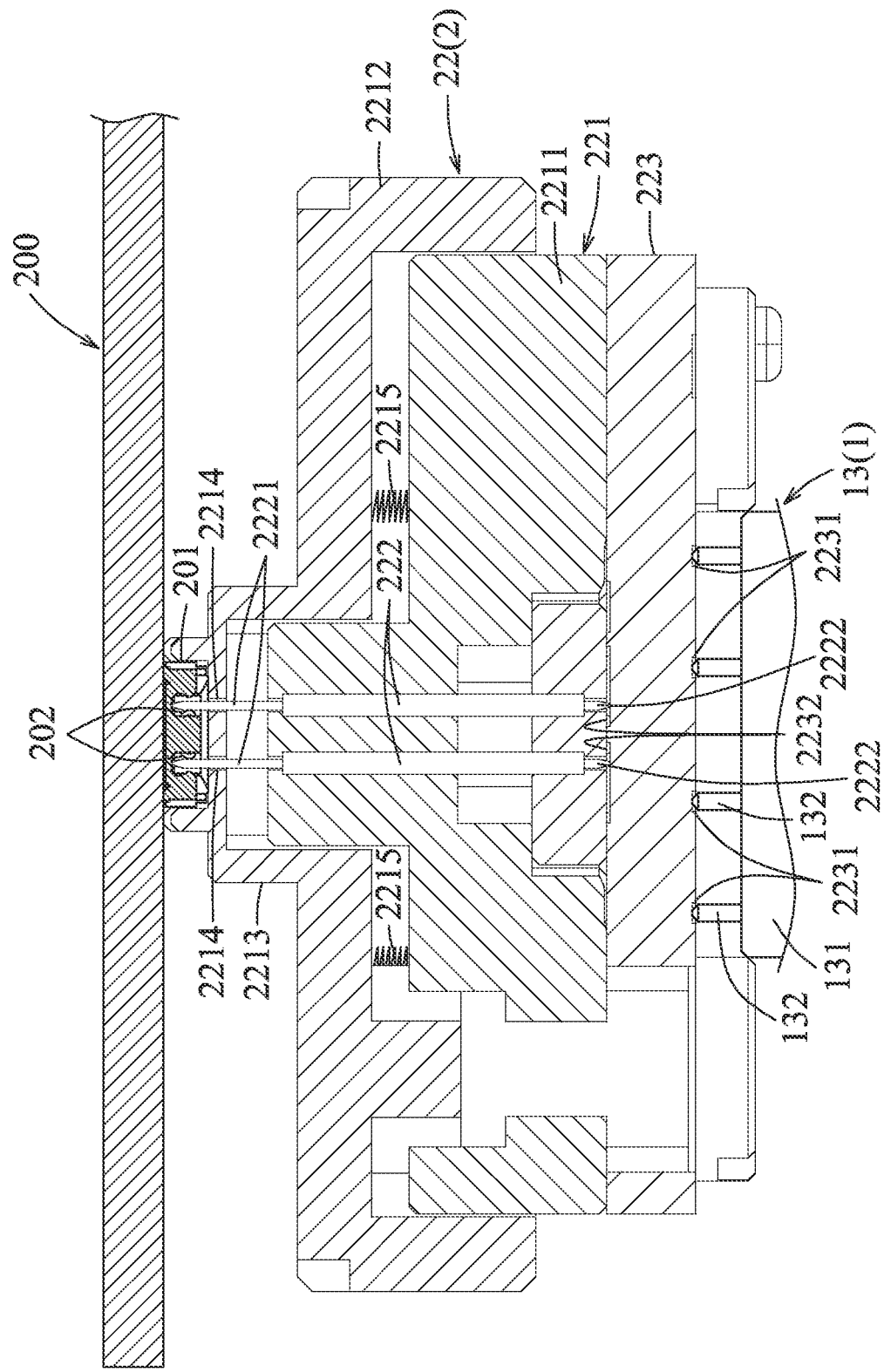
FIG. 6 is a sectional view illustrating the upper module of the upper modular unit and a lower module of a lower modular unit of the embodiment and the electrical device in a state when the upper module is connected with the electrical device.

With reference to FIGS. 5 and 6, when the electrical device 200 is to be connected with the upper modular unit 2, the insert plug 201 is inserted into the socket 2213 with a downward pressing action of the electrical device 200 on the upper modular unit 2, the movable portion 2212 of the upper module housing 221 is moved downwardly from the initial position to the pressed position to permit the upper contact ends 2221 of the upper connecting terminals 222 to project from the through holes 2214 and expose outwardly of the movable portion 2212 so as to contact and electrically connect with the signal contact portions 202 of the insert plug 201. Thus, the upper module 22 of the upper modular unit 2 is connected with the electrical device under test 200. Also, the upper connecting terminals 222 are electrically connected with the lower connecting terminals 132 of the lower modular unit 1. Through the upper connecting terminals 222 of the upper modular unit 2 having the upper contact ends 2221 contacting and electrically connecting with the signal contact portions 202 of the electrical device 200 in a pressing manner, structural wear due to the snap-fit engagement can be avoided and service life of the connecting device may be prolonged. Moreover, the movable portion 2212 of the upper module 22 receives and protects the upper connecting terminals 222 in the initial position when the upper module 22 is not connected with the electrical device 200.

In this embodiment, the upper module 22 further includes a printed circuit board 223 which is disposed under the base seat portion 2211 of the upper module housing 221. The printed circuit board 223 has a plurality of bottom contacts 2231 which are disposed on a bottom surface of the board 223 to contact and electrically connect with the lower connecting terminals 132 of the lower modular unit 1, and a plurality of top contacts 2232 which are disposed on a top surface of the board 223 to contact and electrically connect with the lower contact ends 2222 of the upper connecting terminals 222. Each of the bottom contacts 2231 is spaced apart from an adjacent one of the bottom contacts 2231 by a distance larger than a distance by which each of the top contacts 2232 is spaced apart from an adjacent one of the top contacts 2232. Through the printed circuit board 223, the upper connecting terminals 222 are electrically connected with the lower connecting terminals 132 of the lower modular unit 1. Also, the upper connecting terminals 222 can be electrically connected with the lower connecting terminals 132 when the arrangement of the upper connecting terminals 222 is different from that of the lower connecting terminals 132.

Moreover, the lower modular unit 1, for example, may further include a plurality of resilient bracing members 122 which extend upwardly from the lower module seat 12 to resiliently abut against the upper module seat 21. Each resilient bracing member 122 includes a post and a biasing spring (not shown) disposed in the post. Thus, the bottom contacts 2231 of the board 223 are kept spaced apart from the lower connecting terminals 132 of the lower modular unit 1 when the electrical device under test 200 is not pressed to the upper modular unit 2.

As illustrated, with the upper contact ends 2221 of the upper connecting terminals 222 of the upper modular unit 2 contacting and electrically connecting with the signal contact portions 202 of the electrical device under test 200 in a pressing manner, structural wear due to the snap-fit engagement can be avoided and service life of the connecting device may be prolonged.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A connecting device for electrically connecting an electrical device under test which has a plurality of signal contact portions, comprising:
    a lower modular unit including a port substrate and a plurality of lower connecting terminals each of which is electrically connected with said port substrate at a lower end thereof; and
    an upper modular unit disposed above said lower modular unit and including a plurality of upper connecting terminals movable relative to an upper wall, each of said upper connecting terminals having an upper contact end which is movable as a result of a downward pressing of the electrical device under test on said upper modular unit to project outwardly of said upper wall and to electrically connect with one of the signal contact portions, said upper connecting terminals being electrically connected with said lower connecting terminals of said lower modular unit.

2. The connecting device as claimed in claim 1, wherein said upper modular unit includes at least one upper module which has an upper module housing and said upper connecting terminals, said upper module housing having a base seat portion and a movable portion which is disposed on and movable relative to said base seat portion.

3. The connecting device as claimed in claim 2, wherein said movable portion of said upper module housing has said upper wall, said upper wall having through holes formed therethrough, said upper connecting terminals being mounted on said base seat portion to be kept spaced apart from each other and being inserted into said through holes, respectively.

4. The connecting device as claimed in claim 3, wherein said movable portion is resiliently movable relative to said base seat portion between an initial position and a pressed position such that, as a result of the downward pressing of the electrical device under test, said movable portion is moved downwardly from the initial position to the pressed position to permit said upper contact ends of said upper connecting terminals to project from said through holes and expose outwardly of said movable portion so as to contact and electrically connect with the signal contact portions of the electrical device under test.

5. The connecting device as claimed in claim 4, wherein said upper module further includes a printed circuit board which is disposed under said base seat portion, said printed circuit board having a plurality of bottom contacts which are disposed on a bottom surface thereof to contact and electrically connect with said lower connecting terminals of said lower modular unit, and a plurality of top contacts which are disposed on a top surface thereof to contact and electrically connect with said upper connecting terminals.

6. The connecting device as claimed in claim 5, wherein each of said bottom contacts is spaced apart from an adjacent one of said bottom contacts by a distance larger than a distance by which each of said top contacts is spaced apart from an adjacent one of said top contacts.

7. The connecting device as claimed in claim 6, wherein said upper connecting terminals is electrically connected with said lower connecting terminals of said lower modular unit through said printed circuit board.

8. The connecting device as claimed in claim 2, wherein said upper modular unit further includes an upper module seat and a plurality of said upper modules, each of which is removably mounted on said upper module seat.

9. The connecting device as claimed in claim 8, wherein at least two of said upper modules have different dimensions from each other.

10. The connecting device as claimed in claim 8, wherein said lower modular unit further includes a lower module seat on which said port substrate is disposed, and a plurality of lower modules which are disposed on said port substrate, each of said lower modules having a lower module housing and a plurality of said lower connecting terminals which are mounted on said lower module housing to be kept spaced apart from each other.

11. The connecting device as claimed in claim 10, wherein said lower module housing is removably mounted on said port substrate.

12. The connecting device as claimed in claim 10, wherein said upper and lower module seats respectively have upper and lower movement stabilizing portions which are matingly engageable with each other to stabilize movement of said upper module seat relative to said lower module seat.

13. The connecting device as claimed in claim 12, wherein said upper movement stabilizing portion is in form of a post, said lower movement stabilizing portion being in form of a hole.

14. The connecting device as claimed in claim 3, wherein the electrical device under test has at least one insert plug with the signal contact portions disposed thereon, said movable portion of said upper module housing having a socket which projects from said upper wall and which defines a socket port that is communicated with said through holes for fitting insertion of the insert plug into said socket port.

* * * * *